(12) United States Patent
Iwamoto et al.

(10) Patent No.: US 10,171,061 B2
(45) Date of Patent: Jan. 1, 2019

(54) ELASTIC WAVE DEVICE

(71) Applicant: Murata Manufacturing Co., Ltd., Nagaokakyo-shi, Kyoto-fu (JP)

(72) Inventors: Hideki Iwamoto, Nagaokakyo (JP); Keiji Okada, Nagaokakyo (JP); Yuichi Takamine, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/488,567

(22) Filed: Apr. 17, 2017

(65) Prior Publication Data

US 2017/0222619 A1 Aug. 3, 2017

Related U.S. Application Data

(63) Continuation of application No. PCT/JP2015/079837, filed on Oct. 22, 2015.

(30) Foreign Application Priority Data

Nov. 28, 2014 (JP) .................................. 2014-241810

(51) Int. Cl.
*H03H 9/02* (2006.01)
*H03H 9/145* (2006.01)
(Continued)

(52) U.S. Cl.
CPC .... *H03H 9/02818* (2013.01); *H03H 9/02992* (2013.01); *H03H 9/1457* (2013.01); *H03H 9/14541* (2013.01); *H03H 9/54* (2013.01)

(58) Field of Classification Search
CPC ......... H03H 9/64; H03H 9/6453; H03H 9/145
(Continued)

(56) References Cited

U.S. PATENT DOCUMENTS 6,377,138 B1   4/2002  Takagi et al.
9,712,139 B2 *  7/2017  Taniguchi ............ H03H 9/6483
(Continued)

FOREIGN PATENT DOCUMENTS

JP    2002-314366 A    10/2002
JP    2006-319679 A    11/2006
(Continued)

OTHER PUBLICATIONS

Official Communication issued in Japanese Patent Application No. 2016-561456, dated Apr. 24, 2018.
(Continued)

*Primary Examiner* — Dean Takaoka
(74) *Attorney, Agent, or Firm* — Keating & Bennett, LLP

(57) ABSTRACT

An elastic wave device includes a low acoustic velocity film, a piezoelectric film, and an IDT electrode, which are laminated on a high acoustic velocity material. In the IDT electrode, first electrode fingers, or second electrode fingers, or each of the first electrode fingers and the second electrode fingers, includes a wide width portion with a dimension in a width direction larger than a dimension at a center in a length direction and being provided closer to at least one of a side of a proximal end and a side of a distal end than a central region, at least one of a first busbar and a second busbar includes cavities arranged in a busbar length direction, and at least one of the first busbar and the second busbar includes an inner busbar portion which is positioned closer to a side of the first electrode fingers or a side of the second electrode fingers than the cavities are and which extends in the length direction of the first busbar and the second busbar, a central busbar portion that includes the cavities, and an outer busbar portion.

23 Claims, 13 Drawing Sheets

(51) Int. Cl.
  *H03H 9/64* (2006.01)
  *H03H 9/54* (2006.01)

(58) Field of Classification Search
  USPC .......................................... 333/133, 193–196
  See application file for complete search history.

(56) References Cited

U.S. PATENT DOCUMENTS

| | | |
|---|---|---|
| 2002/0153970 A1 | 10/2002 | Noto |
| 2004/0140734 A1* | 7/2004 | Nakao ................ H03H 9/02677 |
| | | 310/313 R |
| 2007/0120623 A1 | 5/2007 | Sakiyama et al. |
| 2011/0068655 A1 | 3/2011 | Solal et al. |
| 2012/0139653 A1 | 6/2012 | Owaki et al. |
| 2012/0194032 A1 | 8/2012 | Kadota |
| 2013/0051588 A1 | 2/2013 | Ruile et al. |
| 2013/0285768 A1 | 10/2013 | Watanabe et al. |
| 2014/0203893 A1* | 7/2014 | Kando ................ H03H 9/02574 |
| | | 333/187 |
| 2016/0072475 A1* | 3/2016 | Mimura ............ H03H 9/02992 |
| | | 333/195 |

FOREIGN PATENT DOCUMENTS

| | | | | |
|---|---|---|---|---|
| JP | 2007-150931 A | 6/2007 | | |
| JP | 2010-068484 A | 3/2010 | | |
| JP | 2010-206843 A | 9/2010 | | |
| JP | 2011-101350 A | 5/2011 | | |
| JP | 2012-120138 A | 6/2012 | | |
| JP | 2013-518455 A | 5/2013 | | |
| JP | WO 2014192755 A1 * | 12/2014 | ......... | H03H 9/02992 |
| JP | WO 2014192756 A1 * | 12/2014 | ......... | H03H 9/02992 |
| JP | WO 2016084526 A1 * | 6/2016 | ............ | H03H 9/145 |
| KR | 10-2004-0088580 A | 10/2004 | | |
| KR | 10-2012-0049401 A | 5/2012 | | |
| KR | 10-2012-0120355 A | 11/2012 | | |
| WO | 2006/114922 A1 | 11/2006 | | |
| WO | 2011/046117 A1 | 4/2011 | | |
| WO | 2011/088904 A1 | 7/2011 | | |
| WO | 2012/086639 A1 | 6/2012 | | |

OTHER PUBLICATIONS

Official Communication issued in International Patent Application No. PCT/JP2015/079837, dated Nov. 24, 2015.
Official Communication issued in corresponding Korean Patent Application No. 10-2017-7013420, dated Mar. 28, 2018.

\* cited by examiner

ELASTIC WAVE DEVICE

CROSS REFERENCE TO RELATED APPLICATIONS

This application claims the benefit of priority to Japanese Patent Application No. 2014-241810 filed on Nov. 28, 2014 and is a Continuation Application of PCT Application No. PCT/JP2015/079837 filed on Oct. 22, 2015. The entire contents of each application are hereby incorporated herein by reference.

BACKGROUND OF THE INVENTION

1. Field of the Invention

The present invention relates to an elastic wave device preferably for use in, for example, a resonator or a bandpass filter.

2. Description of the Related Art

Hitherto, elastic wave devices have been widely used as resonators or bandpass filters. Japanese Unexamined Patent Application Publication No. 2011-101350 and WO2011/088904 below disclose a structure of a surface acoustic wave device that suppresses a spurious component in transverse modes by providing a piston mode. For example, in FIG. 9 in Japanese Unexamined Patent Application Publication No. 2011-101350 and in FIG. 4 in WO2011/088904, electrode fingers of an IDT electrode include wide width portions. By providing the wide width portions, a low acoustic velocity region is formed.

In FIG. 12 in Japanese Unexamined Patent Application Publication No. 2011-101350 and in FIGS. 8(c) and 9 in WO2011/088904, a film is laminated on part of the IDT electrode. More specifically, in a direction in which the electrode fingers of the IDT electrode extend, the film is laminated in a region that is located outwardly from a central region. This forms a low acoustic velocity region.

However, in the structure in which the electrode fingers include a wide width portion, there is a limit to how large the width of the wide width portions can be made. That is, when the width is too large, the wide width portions contact adjacent electrode fingers, as a result of which the acoustic velocity in the low acoustic velocity region cannot be made sufficiently low. Therefore, it is difficult to reliably suppress the transverse modes. In addition, a method of laminating an additional layer includes complicated steps, and is costly.

SUMMARY OF THE INVENTION

Preferred embodiments of the present invention provide an elastic wave device that suppresses transverse mode ripples without complicating manufacturing steps and increasing costs.

According to a preferred embodiment of the present invention, an elastic wave device includes a piezoelectric film, and a high acoustic velocity material in which an acoustic velocity of a bulk wave that propagates through the high acoustic velocity material is higher than that of an elastic wave that propagates through the piezoelectric film; a low acoustic velocity film which is laminated on the high acoustic velocity material and in which an acoustic velocity of a bulk wave that propagates through the low acoustic velocity film is lower than that of the elastic wave that propagates through the piezoelectric film; the piezoelectric film that is laminated on the low acoustic velocity film; an an IDT electrode that is provided on one surface of the piezoelectric film. The IDT electrode includes a first busbar, a second busbar that is spaced apart from the first busbar, a plurality of first electrode fingers with proximal ends electrically connected to the first busbar and distal ends extending towards the second busbar, and a plurality of second electrode fingers with proximal ends connected to the second busbar and distal ends extending towards the first busbar. When a direction that is perpendicular or substantially perpendicular to a direction in which the first electrode fingers and the second electrode fingers extend is defined as a width direction, the first electrode fingers, or the second electrode fingers, or each of the first electrode fingers and the second electrode fingers, includes a wide width portion with a dimension in the width direction that is larger than a dimension at a center in a length direction of the first electrode fingers and the second electrode fingers and being provided closer to at least one of a side of the proximal end and a side of the distal end than a central region. At least one of the first busbar and the second busbar includes a plurality of cavities that are distributed in a length direction of the first busbar or the second busbar. Each of the first busbar and the second busbar includes an inner busbar portion which is positioned closer to a side of the first electrode fingers or a side of the second electrode fingers than the cavities are and which extends in the length direction of the first busbar and the second busbar, a central busbar portion that includes the cavities, and an outer busbar portion that is positioned opposite to the inner busbar portion with the central busbar portion being interposed therebetween.

In a particular preferred embodiment of an elastic wave device according to the present invention, each inner busbar portion has a shape of a belt that extends in an elastic wave propagation direction.

In another particular preferred embodiment of an elastic wave device according to the present invention, the first electrode fingers and the second electrode fingers each include the wide width portion. In this case, it is possible to even more effectively suppress a ripple.

In still another particular preferred embodiment of an elastic wave device according to the present invention, the first electrode fingers, or the second electrode fingers, or the first electrode fingers and the second electrode fingers each include a plurality of the wide width portions. In this case, it is possible to even more effectively suppress a ripple.

In still another particular preferred embodiment of an elastic wave device according to the present invention, the IDT electrode is a normal IDT electrode not subjected to apodization weighting. In this case, it is possible to easily form the IDT electrode.

In still another particular preferred embodiment of an elastic wave device according to the present invention, when a wavelength of a surface acoustic wave is $\lambda$, a distance between the distal end of each first electrode finger and the second busbar opposing the distal end of each first electrode finger and a distance between the distal end of each second electrode finger and the first busbar opposing the distal end of each second electrode finger is about $0.5\lambda$ or less, for example. In this case, the width of a high acoustic velocity portion in a low acoustic velocity region is able to be made small. Therefore, a propagation mode is able to be brought closer to an ideal piston mode.

In still another particular preferred embodiment of an elastic wave device according to the present invention, the elastic wave device further includes a supporting substrate that supports the high acoustic velocity material, and the high acoustic velocity material is a high acoustic velocity film.

In still another particular preferred embodiment of an elastic wave device according to the present invention, the high acoustic velocity material is a high acoustic velocity supporting substrate.

In still another particular preferred embodiment of an elastic wave device according to the present invention, a polarity of at least one electrode finger in the IDT electrode is reversed and an electrode material is embedded in a gap between the electrode finger whose polarity has been reversed and adjacent electrode fingers on both sides thereof. Therefore, when the elastic wave device is a filter, it is possible to increase the steepness in filter characteristics.

In still another particular preferred embodiment of an elastic wave device according to the present invention, the IDT electrode is made of Al or an alloy whose main constituent is Al, and an electrode film thickness of the IDT electrode is about 0.08λ or greater. In this case, the resistance of the electrode fingers is able to be made small.

In still another particular preferred embodiment of an elastic wave device according to the present invention, a film thickness of the IDT electrode is about 0.10λ or greater and about 400 nm or less, for example. In this case, the resistance of the electrode fingers is able to be made small.

In still another particular preferred embodiment of an elastic wave device according to the present invention, the high acoustic velocity material is a silicon substrate, and a volume resistivity thereof is about 1000 Ωcm or greater, for example. Therefore, when the elastic wave device is a filter, it is possible to reduce insertion loss of the filter.

In still another particular preferred embodiment of an elastic wave device according to the present invention, the high acoustic velocity material is a silicon substrate, and a volume resistivity thereof is about 4000 Ωcm or greater, for example. Therefore, when the elastic wave device is a filter, it is possible to increase the steepness in filter characteristics.

According to elastic wave devices of the present invention, it is possible to provide a piston mode and to effectively suppress transverse mode ripples. Moreover, in order to provide the piston mode, an additional film need not necessarily be laminated. Therefore, it is unlikely that manufacturing steps will become complicated and costs will be increased. Further, it is possible to increase a Q value.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described with reference to the drawings to clarify the present invention.

The preferred embodiments described in the description are exemplifications. The structures according to the preferred embodiments may be partly replaced by structures according to different preferred embodiments, or combined with structures according to different preferred embodiments.

Figure 1:
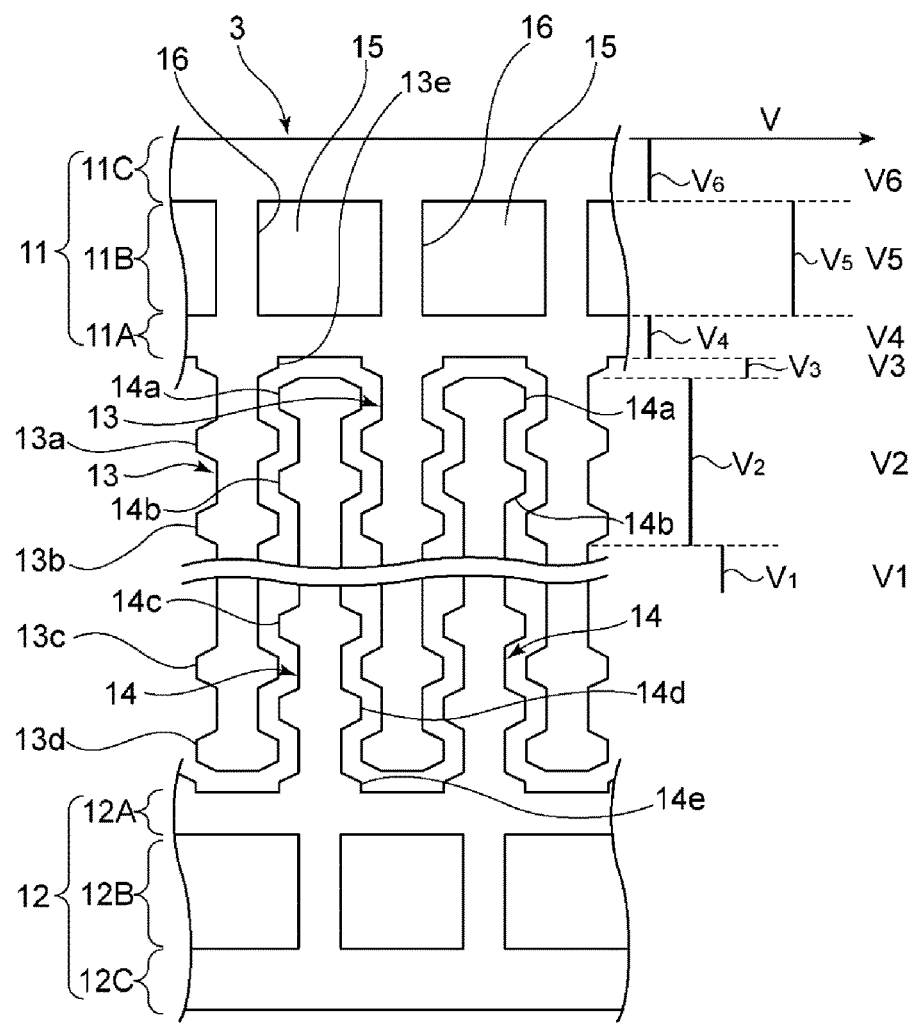
FIG. 1 is a partial cutaway plan view of a main portion of an elastic wave device according to a first preferred embodiment of the present invention.
Figure 2:
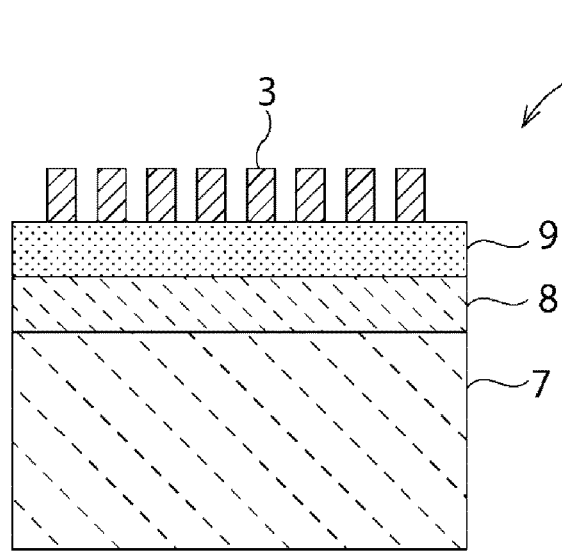
FIG. 2 is a schematic front sectional view of the elastic wave device according to the first preferred embodiment of the present invention.
Figure 3:
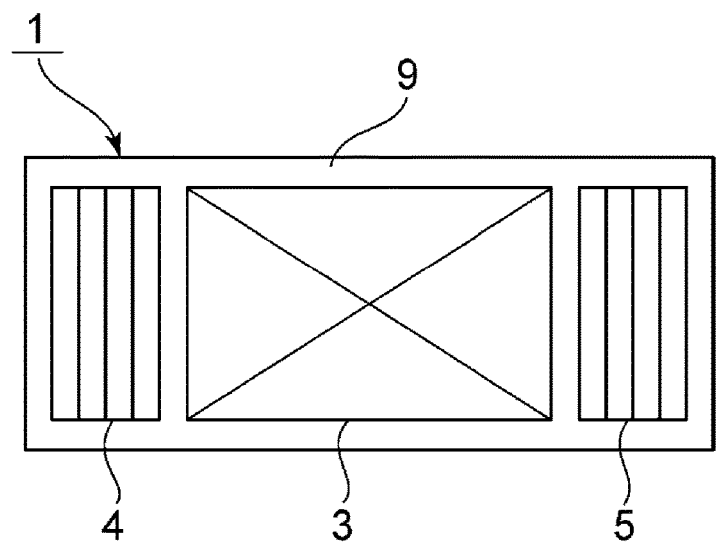
FIG. 3 is a schematic plan view of the elastic wave device according to the first preferred embodiment of the present invention.

FIG. 1 is a partial cutaway plan view of a main portion of an elastic wave device according to a first preferred embodiment of the present invention. FIG. 2 is a schematic front sectional view thereof. FIG. 3 is a schematic plan view of the elastic wave device according to the first preferred embodiment.

As shown in FIG. 2, an elastic wave device 1 includes a high acoustic velocity supporting substrate 7 serving as a high acoustic velocity material. The high acoustic velocity supporting substrate 7 is made of Si. A low acoustic velocity film 8 in which the acoustic velocity is relatively low is laminated on the high acoustic velocity supporting substrate 7. A piezoelectric film 9 is laminated on the low acoustic velocity film 8. An IDT electrode 3 is laminated on an upper surface of the piezoelectric film 9. The IDT electrode 3 may be laminated on a lower surface of the piezoelectric film 9.

In the present preferred embodiment, the piezoelectric film 9 is preferably made of a 50° Y-X LiTaO$_3$ film, for example. For example, if an electromechanical coupling coefficient of the piezoelectric film 9 is relatively large as with, for example, LiNbO$_3$ and LiTaO$_3$, the piezoelectric film 9 may be made of other piezoelectric monocrystals or piezoelectric ceramics. A cut angle is also not limited to 50° Y. In the present preferred embodiment, the thickness of LT preferably is about 0.3λ, for example.

The low acoustic velocity film 8 is made of a material in which the acoustic velocity of an elastic wave that propagates through the piezoelectric film 9 is less than the acoustic velocity of a bulk wave that propagates through the piezoelectric film 9. In the present preferred embodiment, the low acoustic velocity film 8 is made of SiO$_2$. In the present preferred embodiment, the film thickness of SiO$_2$ preferably is about 0.35λ, for example.

As long as the above conditions are met, the material of the low acoustic velocity film 8 is not particularly limited to certain materials. Therefore, the low acoustic velocity film 8 may be made of a dielectric material such as various types of glass or ceramics, such as silicon oxide (for example, SiO$_2$), silicon nitride, alumina, silicon carbide, or zirconia; or may be made of a semiconductor, such as silicon or gallium nitride.

In the description, the term "high acoustic velocity material" refers to a layer in which the acoustic velocity of a bulk wave in the high acoustic velocity material is higher than that of an elastic wave, such as a surface wave or a boundary wave, that propagates through the piezoelectric film. The term "low acoustic velocity film" refers to a film in which the acoustic velocity of a bulk wave in the low acoustic velocity film is lower than that of an elastic wave that propagates through the piezoelectric film. The IDT electrode having a certain structure excites elastic waves of various modes having different acoustic velocities. The "elastic wave that propagates through the piezoelectric film" refers to an elastic wave in a particular mode that is used to acquire filter and resonator characteristics. The mode of the bulk wave that determines the acoustic velocity of the bulk wave is defined in accordance with a use mode of the elastic wave that propagates through the piezoelectric film.

The high acoustic velocity supporting substrate 7 confines a surface acoustic wave in a portion where the piezoelectric film 9 and the low acoustic velocity film 8 are laminated, and to prevent the surface acoustic wave from leaking to a structure below the high acoustic velocity supporting substrate 7. In the present preferred embodiment, the high acoustic velocity supporting substrate 7 preferably is made of Si. As long as the surface acoustic wave can be confined, various types of high acoustic velocity materials may be used. Examples thereof include aluminum nitride, aluminum oxide, silicon carbide, silicon nitride, silicon oxynitride, a DLC film, and diamond; a medium whose main component is any of the aforementioned materials; and a medium whose main component is a mixture of the aforementioned materials.

In order to confine the surface acoustic wave in the portion where the piezoelectric film 9 and the low acoustic velocity film 8 are laminated, it is desirable that the high acoustic velocity material be thick and be about 0.5 times or more of a wavelength λ of the surface acoustic wave; and, more desirably, be about 1.5 times or more of the wavelength λ of the surface acoustic wave, for example.

Figure 18:
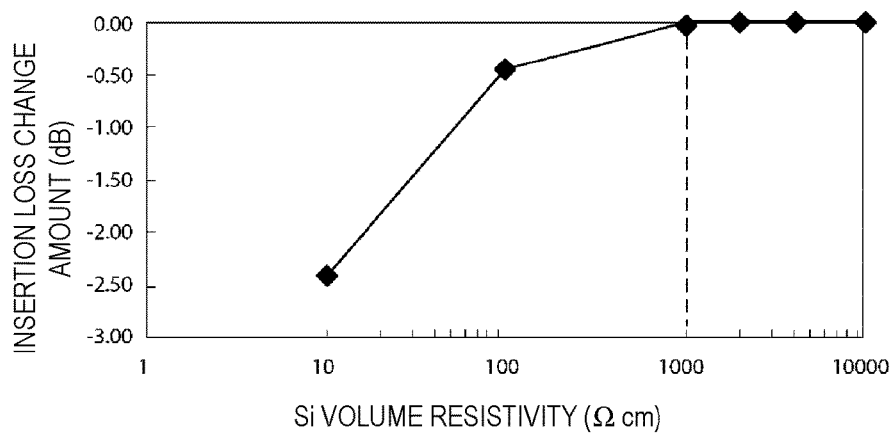
FIG. 18 is a graph showing a relationship between volume resistivity of Si, serving as a material of a high acoustic velocity supporting substrate and the amount of change in insertion loss.

It is desirable that the volume resistivity of the aforementioned high acoustic velocity supporting substrate be about 1000 Ωcm or greater, for example. By using Si having a high electrical resistance, it is possible to acquire even better resonant characteristics and filter characteristics. FIG. 18 shows a relationship between the volume resistivity of Si, which is a material of the high acoustic velocity supporting substrate, and the amount of change in insertion loss. In FIG. 18, the horizontal axis indicates the volume resistivity of Si, and the vertical axis indicates the amount of change in insertion loss in a pass band. When the volume resistivity of the high acoustic velocity supporting substrate, made of Si, is reduced, the insertion loss is increased and degraded. The amount of change in insertion loss along the vertical axis refers to the amount of degradation in insertion loss from a reference corresponding to the insertion loss when the high acoustic velocity supporting substrate is an insulating material. As is clear from FIG. 18, when the volume resistivity of Si is about 1000 Ωcm or greater, for example, the degradation in the insertion loss is able to be reduced or prevented, as a result of which it is possible to acquire good filter characteristics. Therefore, it is desirable that the volume resistivity of the high acoustic velocity supporting substrate, which is made of Si, be about 1000 Ωcm or greater, for example.

Figure 19:
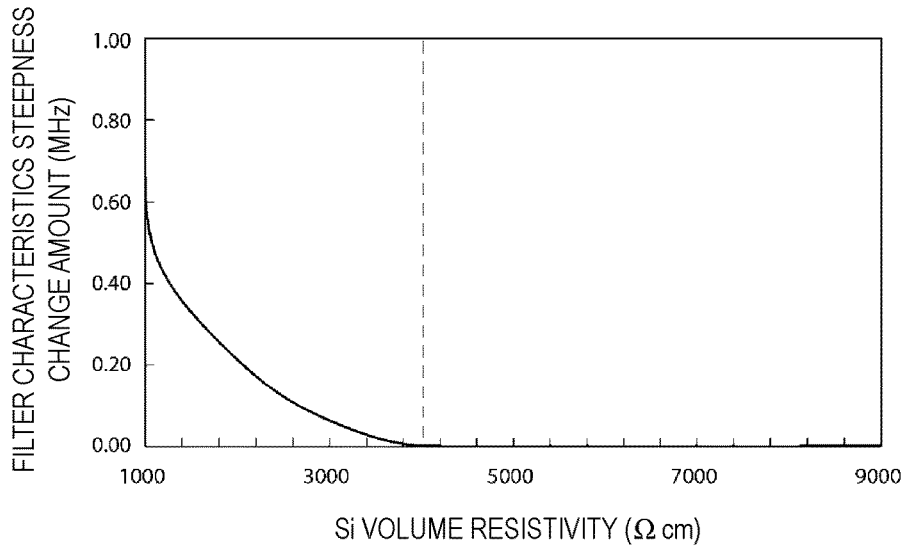
FIG. 19 is a graph showing a relationship between volume resistivity of Si, serving as a material of the high acoustic velocity supporting substrate, and the amount of change in steepness in filter characteristics.

FIG. 19 is a graph showing a relationship between the volume resistivity of Si, which is a material of the high acoustic velocity supporting substrate, and the amount of change in the steepness in filter characteristics. In FIG. 19, the horizontal axis indicates the volume resistivity of Si, and the vertical axis indicates the amount of change in the steepness in filter characteristics. The amount of change in the steepness in filter characteristics refers to the amount of change in the steepness in filter characteristics compared to a reference corresponding to the steepness in filter characteristics when the high acoustic velocity supporting substrate is an insulating material. Here, the steepness in filter characteristics refers to, at a pass band shoulder, the difference between the frequency at which the attenuation is about 3.5 dB and the frequency at which the attenuation is about 40 dB, for example. As the frequency difference is reduced, the steepness is increased. As is clear from FIG. 19, when the volume resistivity of Si is about 4000 Ωcm or greater, for example, the change in steepness is able to be significantly reduced or prevented, as a result of which it is possible to acquire even better filter characteristics. Therefore, it is desirable that the volume resistivity of the high acoustic velocity supporting substrate, which is made of Si, be about 4000 Ωcm or greater, for example.

The volume resistivity of Si is ordinarily $100 \times 10^3$ Ωcm or less.

Figure 17:
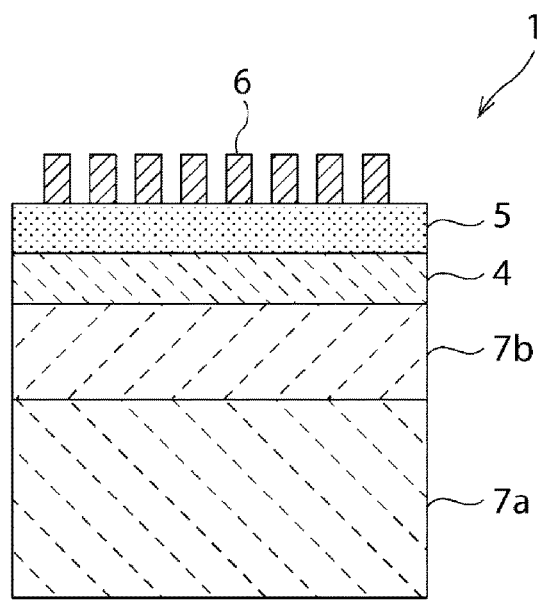
FIG. 17 is a schematic front sectional view of an elastic wave device according to a modification of the first preferred embodiment of the present invention.

As the high acoustic velocity material, in place of the high acoustic velocity supporting substrate 7, a high acoustic velocity film 7b, which is laminated on a supporting substrate 7a, may be used as in the modification shown in FIG. 17. In this case, as the supporting substrate 7a, a suitable material may be used. Examples of such a material include piezoelectric materials, such as sapphire, $LiTaO_3$, $LiNbO_3$, and crystals; dielectric materials such as various types of glass and ceramics, such as alumina, magnesia, silicon nitride, aluminum nitride, silicon carbide, zirconia, cordierite, mullite, steatite, and forsterite; semiconductors, such as silicon and gallium nitride; and resin substrates.

Figure 22:
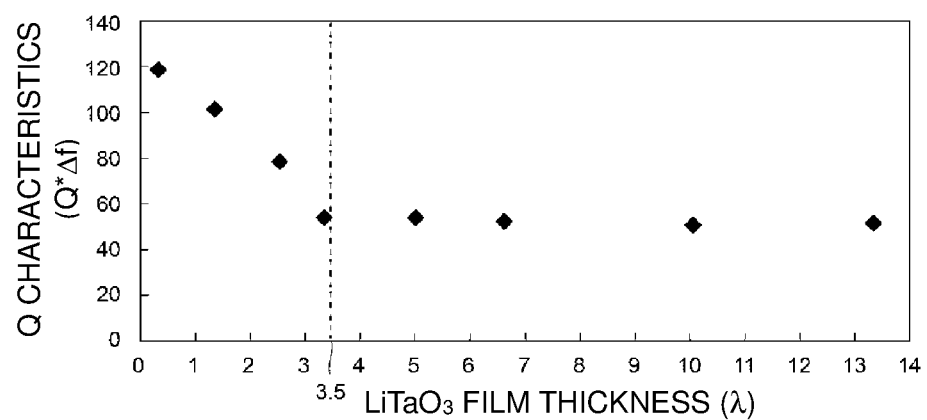
FIG. 22 is a graph showing a relationship between a film thickness of an $LiTaO_3$ film and Q in the elastic wave device.
Figure 23:
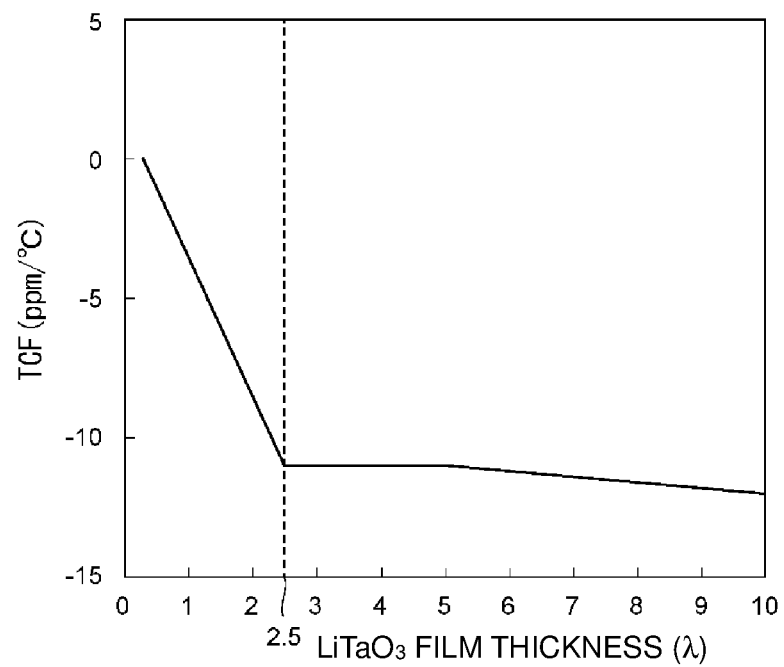
FIG. 23 is a graph showing a relationship between the film thickness of the $LiTaO_3$ film and a temperature coefficient of resonant frequency TCF in the elastic wave device.
Figure 24:
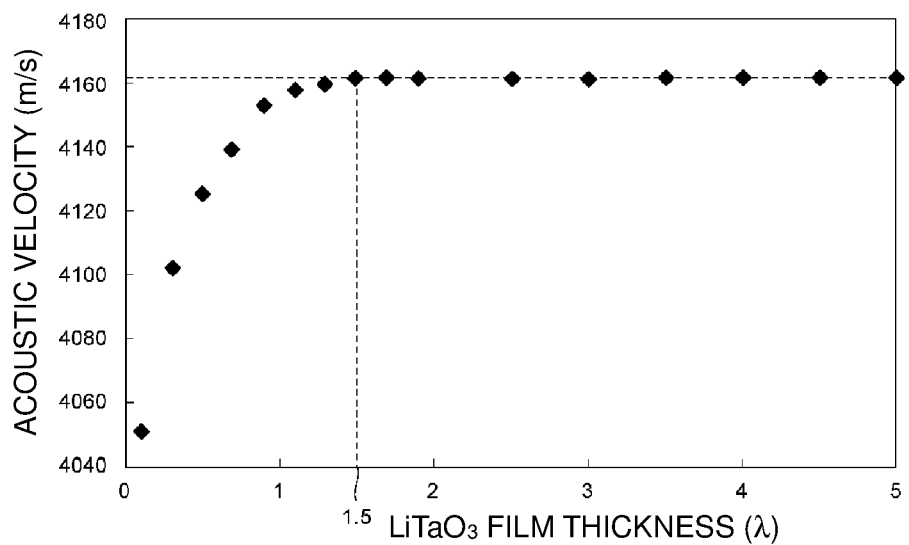
FIG. 24 is a graph showing a relationship between the film thickness of the $LiTaO_3$ film and the acoustic velocity in the elastic wave device.
Figure 25:
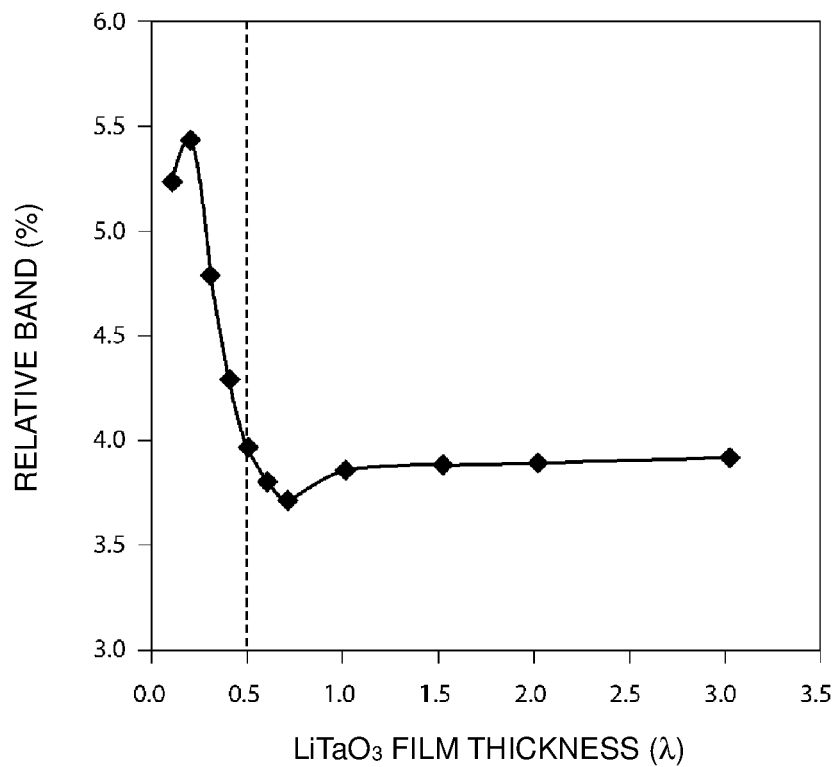
FIG. 25 is a graph showing a relationship between the thickness of a piezoelectric film made of $LiTaO_3$ and a relative band.

In the elastic wave device 1, the low acoustic velocity film 8 is disposed between the high acoustic velocity supporting substrate 7 and the piezoelectric film 9. Therefore, the acoustic velocity of an elastic wave is reduced. On the other hand, elastic wave energy is essentially concentrated in a low acoustic velocity medium. Therefore, it is possible to increase the effect of confining the elastic wave energy in the piezoelectric film 9 and the IDT electrode 3. Consequently, compared to when such a low acoustic velocity film 8 is not provided, it is possible to reduce loss and increase a Q value. As is clear from FIG. 22, when the film thickness of $LiTaO_3$ is about 3.5λ or less, the Q value is higher and Q characteristics are better than those when the film thickness of $LiTaO_3$ is greater than about 3.5λ, for example. FIG. 23 shows that, when the film thickness of $LiTaO_3$ is about 2.5λ or less, the absolute value of a temperature coefficient of resonant frequency TCF can be made less than that when the absolute value of the temperature coefficient of resonant frequency TCF is greater than about 2.5λ, for example. More desirably, in the range of 2λ or less, the absolute value of the temperature coefficient of resonant frequency TCF can be made about −10 ppm/° C. or less, which is desirable. Further, FIG. 24 shows that, when the film thickness of $LiTaO_3$ is about 1.5λ or less, for example, the acoustic velocity is reduced. Therefore, the size of the IDT electrode for acquiring a desired frequency is reduced, so that a device can be reduced in size. Further, as is clear from FIG. 25, when the film thickness of $LiTaO_3$ is about 0.5λ or less, for example, a specific band is increased.

The high acoustic velocity supporting substrate 7 suppresses leakage of an elastic wave to a layer below the high acoustic velocity supporting substrate 7.

Although, in the present preferred embodiment, the low acoustic velocity film 8 and the high acoustic velocity supporting substrate 7, serving as a high acoustic velocity material, are preferably laminated to a lower side of the piezoelectric film 9, a plurality of the low acoustic velocity films and a plurality of the high acoustic velocity materials may be provided by lamination.

FIG. 2 schematically illustrates an electrode structure including the IDT electrode 3. As shown in FIG. 3, in the elastic wave device 1, reflectors 4 and 5 are provided on respective sides of the IDT electrode 3 in a propagation direction of a surface acoustic wave. That is, the elastic wave device 1 is a one-port surface acoustic wave resonator.

FIG. 3 schematically illustrates the IDT electrode 3 by a symbol including an X surrounded by a rectangular or substantially rectangular frame. The details of the IDT electrode 3 are described with reference to FIG. 1.

The IDT electrode 3 is a normal IDT electrode not subjected to apodization weighting. The electrode finger period preferably is about 2.0 μm, for example. The electrode finger period of the IDT electrode is not particularly limited to certain periods. The number of pairs of electrode fingers preferably is 150 pairs, and a crossing portion measures about 10λ (λ is the wavelength of an elastic wave that is excited at the IDT electrode), for example. The reflectors 4 and 5 are grating-type reflectors whose two end are short circuited. The number of electrode fingers at the reflectors 4 and 5 preferably is 20, for example.

In the present preferred embodiment, the IDT electrode 3 and the reflectors 4 and 5 are defined by a multilayer metal film including a Ti film and an Al film laminated on the Ti film. The thickness of the Ti film preferably is about 10 nm, and the thickness of the Al film is preferably about 167 nm, for example. In the multilayer metal film, the Al film is the predominant film, and has a thickness of 167 nm=about 0.0835λ, for example.

The metals included in the IDT electrode 3 are not limited to these metals. Suitable metals or alloys may be used.

As mentioned above, the thickness of the IDT electrode whose main constituent is Al preferably is about 0.0835λ, for example. However, according to an experiment conducted by the inventors for the present application, it is desirable that the thickness be about 0.08λ or greater, for example. Therefore, an elastic wave filter achieves increased steepness in filter characteristics.

Figure 20:
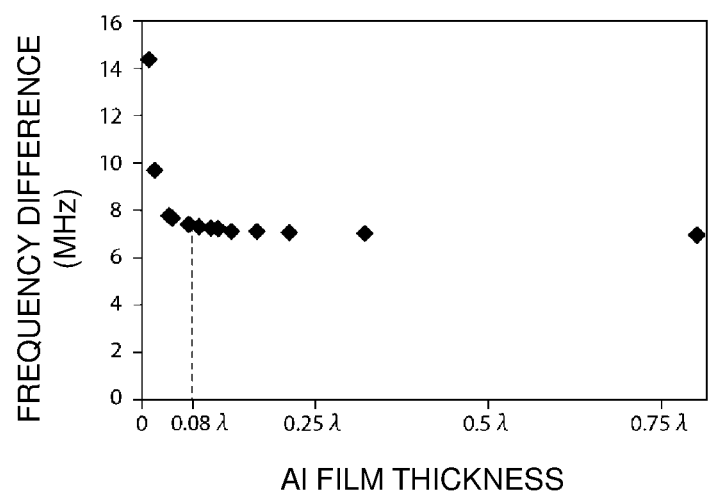
FIG. 20 is a graph showing a change in frequency difference when the film thickness of Al is changed.

FIG. 20 is a graph showing a change in the frequency difference when the film thickness of Al is varied. This frequency difference is a frequency difference at a pass band shoulder, and is the difference between the frequency at which the attenuation is about 3.5 dB and the frequency at which the attenuation is about 40 dB, for example. As the frequency difference is reduced, the steepness at the shoulder is increased.

As is clear from FIG. 20, when the film thickness of the Al film becomes less than about 0.08λ, as the film thickness of the Al film is reduced, the frequency difference is considerably increased. In contrast, when the Al film thickness is about 0.08λ or greater, the frequency difference is substantially constant and is small. Therefore, it is desirable that the film thickness of the Al film be about 0.08λ or greater, for example.

Further, it is desirable that the film thickness of the IDT electrode 3 be about 0.1λ or greater, for example. This makes it possible to reduce the electrical resistance of each electrode finger. Consequently, it is possible to reduce loss.

Figure 21:
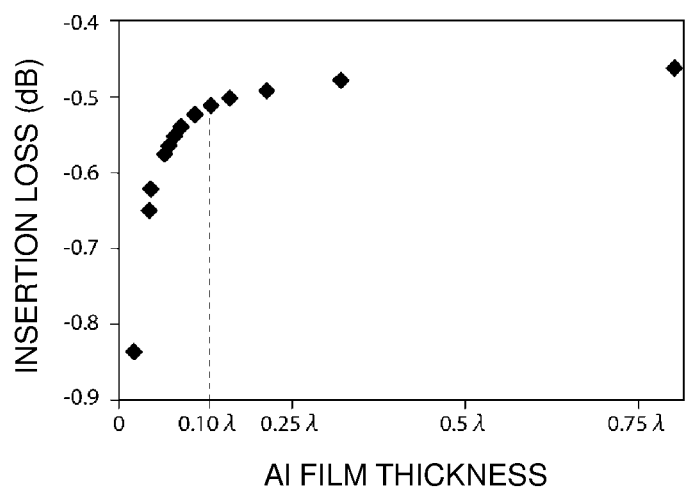
FIG. 21 is a graph showing a change in insertion loss when the film thickness of Al is changed.

FIG. 21 is a graph showing a change in insertion loss when the film thickness of the Al film is varied. The insertion loss refers to a minimum insertion loss in which the insertion loss is smallest in a pass band.

As is clear from FIG. 21, when the film thickness of the Al film is about 0.10λ or greater, the insertion loss is sufficiently small, so that variations in the insertion loss are small when the film thickness of the Al film is varied. Therefore, even more desirably, the film thickness of the Al film is about 0.10λ or greater, for example. Since it is difficult to manufacture Al films when they are too thick, it is desirable that the film thickness be about 400 nm or less, for example. Therefore, it is desirable that the film thickness of the IDT electrode be about 400 nm or less, for example.

An $SiO_2$ film may be formed so as to cover the electrode structure shown in FIG. 1. This makes it possible to improve frequency temperature characteristics.

The elastic wave device 1 according to the present preferred embodiment has a structure that suppresses transverse mode ripples by providing a piston mode at the IDT electrode 3. This is described with reference to FIG. 1.

The IDT electrode 3 includes a first busbar 11 and a second busbar 12 that is spaced apart from the first busbar 11. The first busbar 11 and the second busbar 12 extend parallel or substantially parallel to the propagation direction of a surface acoustic wave.

Proximal ends of a plurality of first electrode fingers are connected to the first busbar 11. Distal ends of the plurality of first electrode fingers 13 extend towards the second busbar 12 from the first busbar 11. That is, the plurality of first electrode fingers 13 extend in a direction perpendicular or substantially perpendicular to the propagation direction of a surface acoustic wave.

Proximal ends of a plurality of second electrode fingers 14 are connected to the second busbar 12. Distal ends of the plurality of second electrode fingers 14 extend towards the first busbar 11 from the second busbar 12. That is, the plurality of second electrode fingers 14 also extend in a direction perpendicular or substantially perpendicular to the propagation direction of a surface acoustic wave.

The plurality of first electrode fingers 13 and the plurality of second electrode fingers 14 are interposed between adjacent second electrode fingers 14 or adjacent first electrode fingers 13. Each first electrode finger 13 includes wide width portions 13a, 13b, 13c, and 13d. Each second electrode finger 14 also includes wide width portions 14a, 14b, 14c, and 14d. The shape of the wide width portions 13a to 13d and the shape of the wide width portions 14a to 14d are described with the shape of the wide width portion 13a being described so as to represent the shapes of the other wide width portions. Each wide width portion 13a has a dimension in a width direction, that is, a dimension in the propagation direction of a surface acoustic wave that is larger than that of a remaining portion of the corresponding first electrode finger 13. In the present preferred embodiment, each wide width portion 13a has the shape of an isosceles trapezoid protruding from side edges of the corresponding electrode finger 13 in the propagation directions of a surface acoustic wave. The shape of each wide width portion is not limited thereto, so that protrusions having various other shapes, such as semicircular protrusions, may be caused to protrude from the side edges of the corresponding electrode finger 13 in the propagation directions of a surface acoustic wave.

The wide width portions 13a and 13b of each first electrode finger 13 are provided towards the side of the proximal end of the corresponding first electrode finger 13. In other words, the wide width portions 13a and 13b are provided towards the side of the first busbar 11. The wide width portions 13c and 13d are provided towards the side of the distal end of the corresponding first electrode finger 13, that is, towards the side of the second busbar 12.

The wide width portions 14a and 14b of each second electrode finger 14 are provided towards the side of the distal end of the corresponding second electrode finger 14. The wide width portions 14a and 14b and the wide width portions 13a and 13b are alternately disposed in a region near the corresponding first busbar 11 in a direction that is perpendicular or substantially perpendicular to the propagation direction of a surface acoustic wave, that is, in a direction in which the electrode fingers extend. Similarly, the wide width portions 13c and 13d and the wide width portions 14c and 14d are alternately disposed on the side near the second busbar 12 in the direction in which the electrode fingers extend.

In a region where the wide width portions 13a and 13b and the wide width portions 14a and 14b are provided, a region V2 shown in FIG. 1 is provided. V1 to V6 on the right side in FIG. 1 are regions disposed towards the outer side from the center of the IDT electrode 3 in a direction perpendicular or substantially perpendicular to the propagation direction of a surface acoustic wave. Velocities V1 to V6 of an elastic wave that propagates through the regions V1 to V6 (hereunder referred to as acoustic velocities) are schematically shown in FIG. 1. In the specification, the acoustic velocity in a region Vn (where n is a natural number) is V. Here, the region V1 is an IDT central region located between the wide width portions 13b and the wide width portions 13c.

The acoustic velocity in the region V2, where the wide width portions 13a, 13b, 14a, and 14b are provided, is lower than the acoustic velocity in the region V1 at the IDT center.

In the present preferred embodiment, protrusions 13e protruding in an electrode finger width direction are provided on the proximal ends of the corresponding electrode fingers 13. Therefore, the acoustic velocity in the region V3, where the protrusions 13e are provided, is lower than the acoustic velocity in the region V5 of a high acoustic velocity portion (described later). Since the second electrode fingers 14 do not exist in the region V3, the acoustic velocity V3 in the region V3 is higher than the acoustic velocity V2 in the region V2.

As described above, a structure including the low acoustic velocity region V2 realized as a result of providing the wide width portions 13a, 13b, 14a, and 14b is described in Japanese Unexamined Patent Application Publication No. 2011-101350 and WO2011/088904. Even at the second busbar 12, similarly, a region where the wide width portions 13c, 13d, 14c, and 14d are provided is a region V2.

In the present preferred embodiment, the first busbar 11 includes an inner busbar portion 11A, a central busbar portion 11B, and an outer busbar portion 11C. Here, in the direction in which the electrode fingers of the IDT electrode 3 extend, the term "inner" refers to a side where the first electrode fingers 13 and the second electrode fingers 14 exist, and the term "outer" refers to a side opposite thereto.

The inner busbar portion 11A is a portion to which the proximal ends of the plurality of first electrode fingers 13 are connected. In the present preferred embodiment, the inner busbar portion 11A has the shape of a long and narrow belt extending in the propagation direction of a surface acoustic wave. Since this is a portion that is metallized, the inner busbar portion 11A defines the low acoustic velocity region V4.

A plurality of cavities 15 are distributed in the central busbar portion 11B along the propagation directions of a surface acoustic wave. In the present preferred embodiment, the cavities 15 are positioned between corresponding connecting portions 16 and 16 extending in a direction in which the electrode fingers extend. In the present preferred embodiment, the width of the connecting portions 16 is the same as the width of the first electrode fingers 13, and the connecting portions 16 extend on extension lines from the first electrode fingers 13. The dimensions and the positions of the connecting portions 16 are not limited thereto. Although, in the present preferred embodiment, the cavities 15 preferably have rectangular shapes, for example, but the shapes thereof are not limited to rectangular shapes.

At the central busbar portion 11B, the connecting portions 16 and the cavities 15 are alternately disposed along the propagation direction of a surface acoustic wave. Therefore, since there are many portions that are not metallized, the central busbar portion 11B defines the high acoustic velocity region V5. The outer busbar portion 11C does not have cavities. Therefore, the outer busbar portion 11C is a metallized region, and the region V6 is a low acoustic velocity region.

Similarly, the second busbar 12 includes an inner busbar portion 12A, a central busbar portion 12B, and an outer busbar portion 12C. Corresponding portions are given the same reference numerals, and are not described.

In the elastic wave device 1, since the IDT electrode 3 has the above-described structure, the low acoustic velocity regions are provided at the outer side of the central region V1, and the high acoustic velocity region V5 exists at the outer side of the regions V2 to V4, which are low acoustic velocity regions. Therefore, it is possible provide a piston mode, and to effectively suppress transverse mode ripples. Further, it is possible to effectively confine an elastic wave. This is described in detail with reference to FIGS. 4 to 7.

Figure 4:
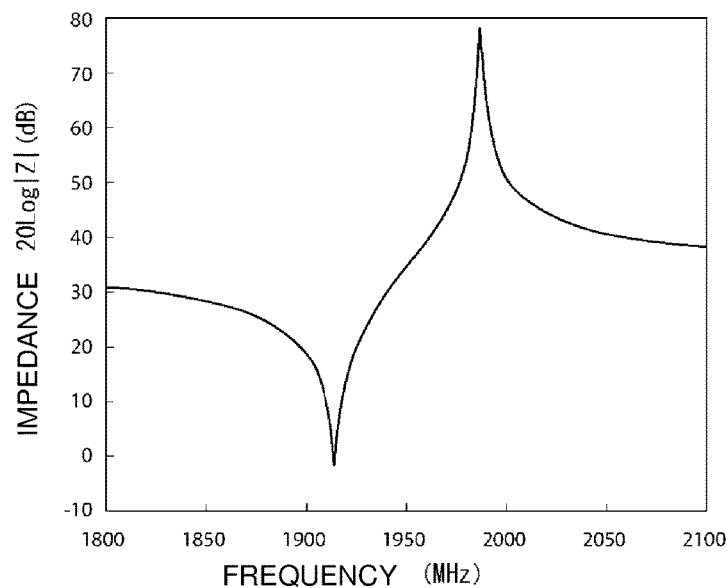
FIG. 4 is a graph showing impedance frequency characteristics of the elastic wave device according to the first preferred embodiment of the present invention.
Figure 5:
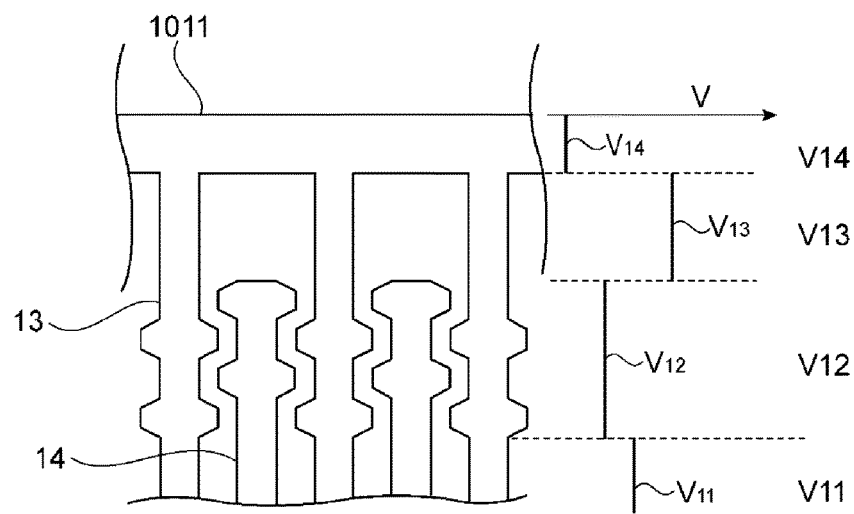
FIG. 5 is a partial cutaway plan view of a main portion of an elastic wave device according to a comparative example.
Figure 6:
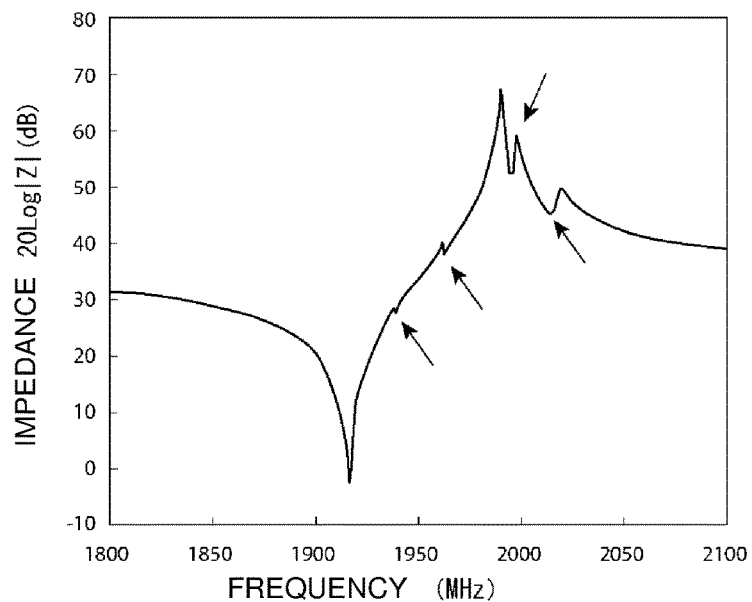
FIG. 6 is a graph showing impedance frequency characteristics of the elastic wave device according to the comparative example.

FIG. 4 is a graph showing impedance frequency characteristics of the elastic wave device according to the first preferred embodiment. FIG. 6 is a graph showing impedance frequency characteristics of an elastic wave device according to a comparative example. The main portion of an IDT electrode of the elastic wave device according to the comparative example is described with reference to FIG. 5. As shown in FIG. 5, in the comparative example, a first busbar 1011 includes only a thick belt-shaped metallized region. That is, in the comparative example, unlike the above-described preferred embodiment, a central busbar portion 11B having a plurality of cavities 15 is not provided. Therefore, the portion where the first busbar 1011 is provided is a low acoustic velocity region denoted by V14.

In the comparative example, the protrusions 13e shown in FIG. 1 are not provided. The other structural features according to the comparative example are the same as those according to the above-described preferred embodiment. Acoustic velocities $V_{11}$ to $V_{14}$ in respective regions V11 to V14 in the direction in which the electrode fingers of the IDT electrode of the elastic wave device according to the comparative example extend are schematically shown on the right side in FIG. 5.

As is clear by a comparison between FIG. 4 and FIG. 6, in FIG. 6, large ripples appear between resonant frequency and anti-resonant frequency and at a region where frequencies are higher than the anti-resonant frequency. The ripples are called transverse mode ripples. In contrast, in FIG. 4, such ripples do not appear.

In the above-described preferred embodiment, the acoustic velocities $V_1$ to $V_6$ in the respective regions V1 to V6 are as shown in FIG. 1. That is, since the inner busbar portion 11A is provided in addition to the wide width portions 13a, 13b, 14a, and 14b, the average value of the acoustic velocities in the regions V2, V3, and V4, which are low acoustic velocity regions, is effectively reduced.

Therefore, an acoustic velocity difference ΔV between the acoustic velocity in a low acoustic velocity region and the acoustic velocity in the central region is very large. Consequently, it is possible to effectively suppress the transverse mode ripples. That is, as the acoustic velocity difference ΔV is increased, the piston mode is reliably provided, so that it is possible to effectively suppress the transverse mode ripples.

Figure 7:
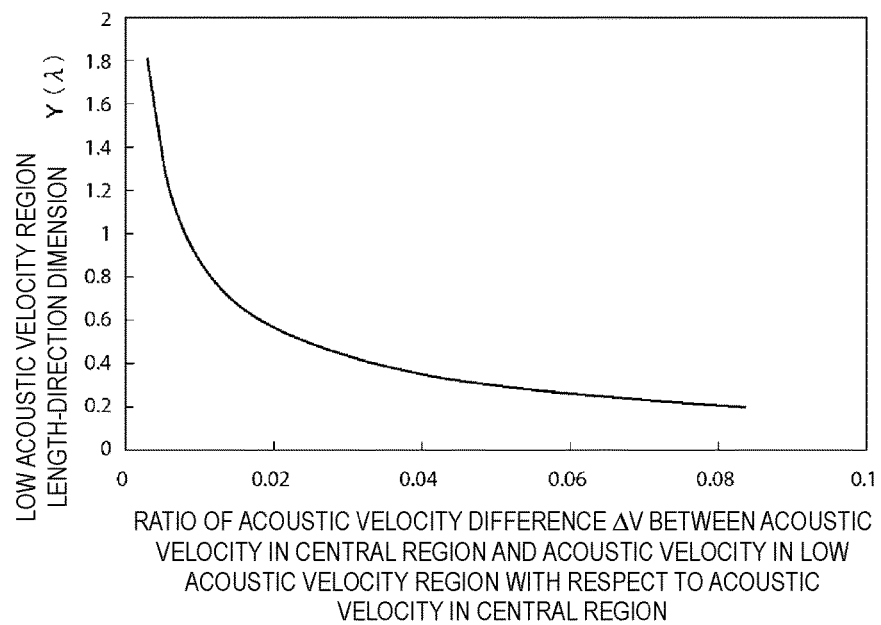
FIG. 7 is a graph showing a relationship between a ratio of an acoustic velocity difference ΔV with respect to the acoustic velocity in a central region and a dimension Y of a low acoustic velocity region in a length direction thereof when a piston mode is provided, the acoustic velocity difference ΔV being the difference between the acoustic velocity in the central region and the acoustic velocity in the low acoustic velocity region.

FIG. 7 is a graph showing a relationship between a ratio of the acoustic velocity difference ΔV with respect to the acoustic velocity in the central region and a dimension Y of a low acoustic velocity region in a length direction in which the electrode fingers extend when the conditions for providing a piston mode are met, the acoustic velocity difference ΔV being the difference between the acoustic velocity of the central region and the acoustic velocity of the low acoustic velocity region. As is clear from FIG. 7, when the dimension Y of the low acoustic velocity region in the length direction in which the electrode fingers extend is small, the acoustic velocity difference ΔV between the acoustic velocity in the central region and the acoustic velocity in the low acoustic velocity region required for providing the piston mode is increased. In order to provide an ideal piston mode that is able to suppress all transverse mode ripples, it is desirable that the dimension Y be small. That is, it is desirable that the acoustic velocity difference ΔV between the acoustic velocity in the central region and the acoustic velocity in the low acoustic velocity region be large.

In the structure according to the comparative example shown in FIG. 5, since a low acoustic velocity region only includes wide width portions, the acoustic velocity difference between the acoustic velocity in the central region and the acoustic velocity in the low acoustic velocity region cannot be made so large. Therefore, in order to provide the piston mode, the dimension Y needs to be large. However, in this case, the ideal piston mode cannot be provided. Therefore, as shown in FIG. 6, the transverse mode ripples occur.

In contrast, in the structure according to the preferred embodiment, since the inner busbar portion 11A is provided, the acoustic velocity difference ΔV between the acoustic velocity in the central region and the acoustic velocity in the low acoustic velocity region is able to be made large, and the dimension Y required to provide the piston mode is able to be made small. Therefore, it is possible to provide the ideal piston mode. Consequently, as shown in FIG. 4, it is possible to effectively suppress the transverse mode ripples.

Experiments conducted by the inventors for the present application have confirmed that it is desirable that, in portions where, for example, the wide width portions 13a, 13b, 14a, and 14b are provided, the duty ratio of the electrode fingers be in the range of about 0.6 to 0.9 about, for example. As the duty ratio is increased, the acoustic velocity difference ΔV is able to be made large. Due to process-related limitations, it is desirable that the duty ratio be about 0.9 or less, for example.

In the present preferred embodiment, it is desirable that the distance between the distal ends of the second electrode fingers 14 and the first busbar 11 along a direction perpendicular or substantially perpendicular to the propagation direction of a surface acoustic wave, that is, the size of a gap, indicated by the region V3, between the distal ends of the electrode fingers and the corresponding busbar be small. In order to reduce the dimension of the region V3, there are process-related limitations. Experiments conducted by the inventors for the present application reveal that, when the wavelength of a surface acoustic wave is λ, the distance is desirably about 0.5λ or less, and, more desirably, about 0.25λ or less, for example.

Since the protrusions 13e and 14e are provided, in the present preferred embodiment, the electrode finger width direction dimension in the region V3 is larger than the width of the electrode fingers 13 and 14 in the region V1. Therefore, the relationship is the acoustic velocity $V_1$<the acoustic velocity $V_3$. The protrusions 13e and 14e need not be provided. Therefore, the width of the electrode fingers 14 in the region V3 may be equal to the width of the electrode fingers 14 in the region V1, which is a central region.

As in the present preferred embodiment, it is desirable that the protrusions 13e and 14e be provided in the region V3 and to even further reduce the acoustic velocity in the region V3. That is, the average value of the acoustic velocities V2 to V4 as a whole in the respective regions V2 to V4, which are low acoustic velocity regions, can be further reduced.

The region V4, where the inner busbar portion 11A is positioned, is also a low acoustic velocity region. Here, as mentioned above, since the entire inner busbar portion 11A is metallized, the acoustic velocity is effectively reduced. The inner busbar portion 11A has the shape of a long and narrow belt. It is desirable that the dimension of the inner busbar portion 11A in a direction perpendicular or substantially perpendicular to the propagation direction of an elastic wave, that is, the width of the inner busbar portion 11A be about 0.5λ or less, for example.

In the present preferred embodiment, the width of the connecting portions 16 of the central busbar portion 11B is equal or substantially equal to the width of the electrode fingers 13 and 14 in the region V1. The width-direction dimension of the connecting portions 16 need not be necessarily equal to the width-direction dimension of the electrode fingers 13 and 14.

The duty ratio of the electrode fingers in the region V1 is preferably about 0.5, for example. In the present preferred embodiment, the width of the central busbar portion 11B, which is a high acoustic velocity region, in a direction perpendicular to the propagation direction of an elastic wave is preferably about 2.0λ, for example. The high acoustic velocity region only needs to have a width that allows the energy of a surface acoustic wave that is excited by the IDT electrode to be sufficiently small at the outer busbar portion 11C. When the width of the central busbar portion 11B is about 2.0λ or greater, for example, the excitation by the outer busbar portion 11C is able to be made sufficiently small.

In the present preferred embodiment, as mentioned above, the wide width portions 13a, 13b, 13c, and 13d, and the wide width portions 14a, 14b, 14c, and 14d are provided. The regions V2 to V4, which are low acoustic velocity regions, and the region V5, which is a high acoustic velocity region having the cavities 15, are provided at the outer side of the region V1 serving as a central region. Since the acoustic difference ΔV between the acoustic velocity in the central region and the average of the acoustic velocities in the low acoustic velocity regions is very high, it is possible to effectively suppress the transverse mode ripples. This is because, as the acoustic velocity difference ΔV is increased, a piston mode that is close to the ideal piston mode is able to be provided. Therefore, as shown in FIG. 4, it is possible to effectively suppress a transverse mode spurious component.

FIGS. 8 to 15 are partial cutaway plan views of main portions of elastic wave devices according to a second preferred embodiment to a ninth preferred embodiment of the present invention.

Figure 8:
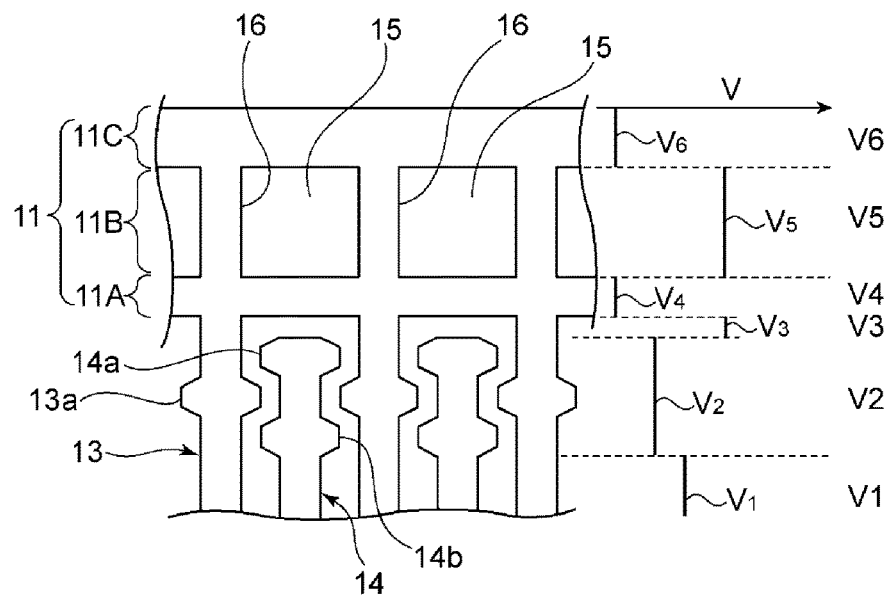
FIG. 8 is a partial cutaway plan view of a main portion of an elastic wave device according to a second preferred embodiment of the present invention.

As in the second preferred embodiment shown in FIG. 8, the protrusions 13e shown in FIG. 1 need not be provided at proximal ends of first electrode fingers 13. In the second preferred embodiment, protrusions are similarly not provided at proximal ends of second electrode fingers 14.

In the second preferred embodiment, each first electrode finger 13 includes one wide width portion 13a, whereas adjacent second electrode fingers 14 each include two wide width portions 14a and 14b. Therefore, 1.5 pairs of protrusions are disposed. The relationship between acoustic velocities $V_1$ to $V_6$ in regions V1 to V6 is as indicated on the right side in FIG. 8, and the acoustic velocity $V_3$ and the acoustic velocity $V_5$ are equal or substantially equal to each other. Even in this preferred embodiment, the average value of the acoustic velocities $V_2$ to $V_4$ in the regions V2 to V4, which are low acoustic velocity regions, is effectively made lower than the acoustic velocity $V_1$ in the region V1, which is a central region. Therefore, as in the first preferred embodiment, it is possible to effectively suppress transverse mode ripples. The other structural features according to the second preferred embodiment are the same as those according to the first preferred embodiment.

Figure 9:
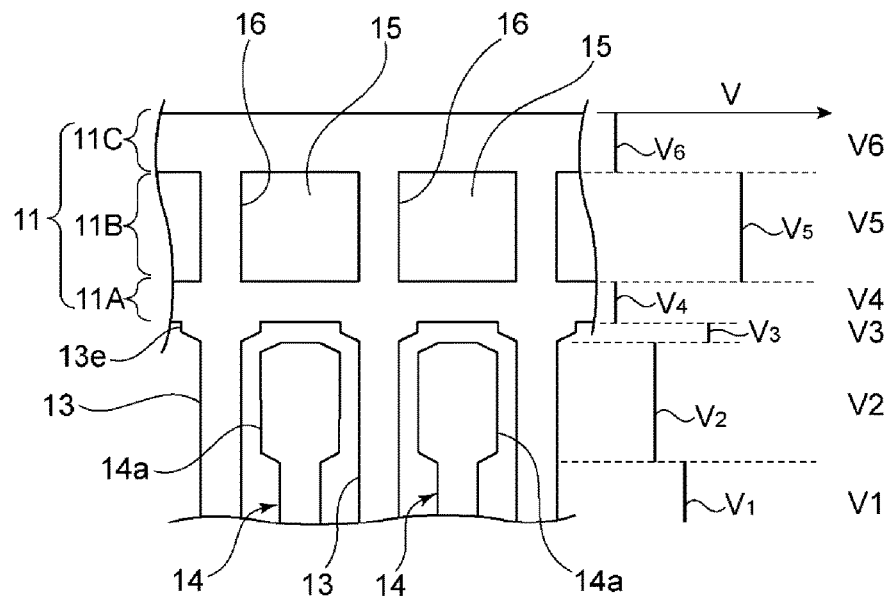
FIG. 9 is a partial cutaway plan view of a main portion of an elastic wave device according to a third preferred embodiment of the present invention.

In the third preferred embodiment shown in FIG. 9, a distal end of each second electrode finger 14 includes a wide width portion 14a on the side of a first busbar 11. First electrode fingers 13 do not include wide width portions in the vicinity of portions where the wide width portions 14a are formed. The other structural features are the same as those according to the first preferred embodiment. Acoustic velocities $V_1$ to $V_6$ in regions V1 to V6 according to the preferred embodiment are schematically shown on the right side in FIG. 9. Even in the present preferred embodiment, the average value of the acoustic velocities $V_2$ to $V_4$ in the regions V2 to V4 is effectively made lower than the acoustic velocity $V_1$ in the region V1, which is a central region. Therefore, as in the first preferred embodiment, it is possible to effectively suppress transverse mode ripples.

Only the first electrode fingers 13 or only the second electrode fingers 14 may include a wide width portion. The number of wide width portions may be such that one electrode finger includes only one wide width portion 14a on the side of the busbar 11.

In this preferred embodiment, as with the wide width portions 14a, one wide width portion is provided on the side of a distal end of each first electrode finger 13, and each second electrode finger 14 does not include a wide width portion on the side of the second busbar 14.

Figure 10:
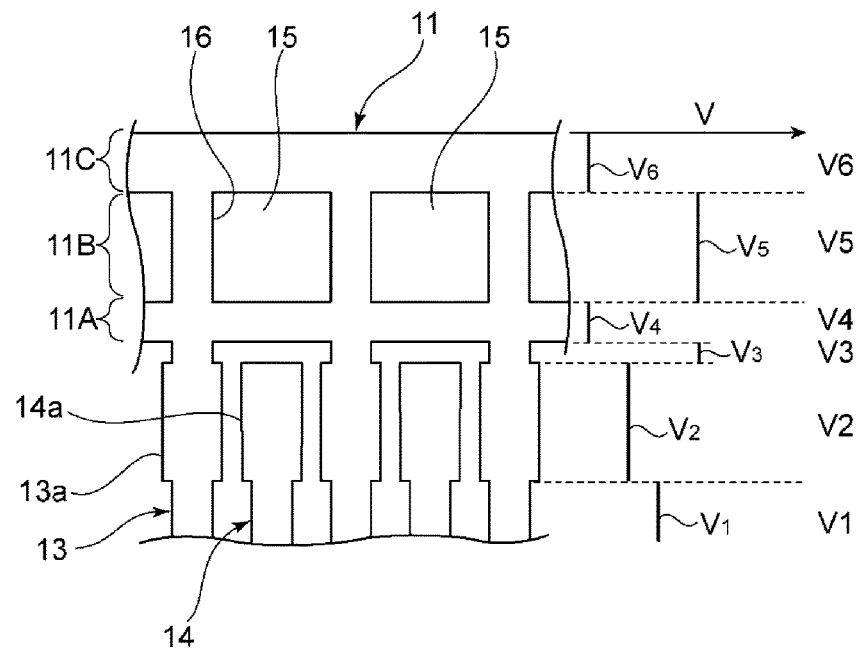
FIG. 10 is a partial cutaway plan view of a main portion of an elastic wave device according to a fourth preferred embodiment of the present invention.

In the fourth preferred embodiment shown in FIG. 10, each first electrode 13 includes a wide width portion 13a and each second electrode finger 14 includes a wide width portion 14a on the side of a first busbar 11. That is, in a region towards the side of the first busbar 11, in order to form a low acoustic velocity region, each electrode finger 13 includes one wide width portion 13a and each electrode finger 14 includes one wide width portion 14a. The protrusions 13e shown in FIG. 1 are not provided on proximal ends of the electrode fingers 13. The protrusions are also not provided at proximal ends of the second electrode fingers either.

Even on the side of a distal end of each first electrode finger 13, that is, on the side of a second busbar, one wide width portion is provided on the distal end of each first electrode finger and in the vicinity of a proximal end of each second electrode finger.

As in the present preferred embodiment, each electrode finger 13 and each electrode finger 14 may include one wide width portion to effectively reduce an acoustic velocity $V_2$ in a low acoustic velocity region $V_2$. Even in this case, as in the first to third preferred embodiments, it is possible to effectively suppress transverse mode ripples on the basis of a piston mode principle.

Figure 11:
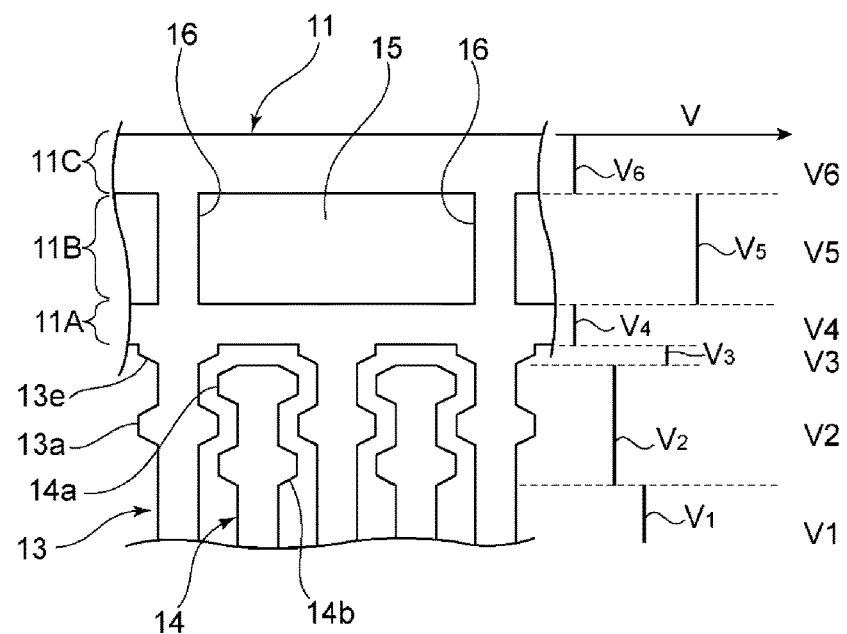
FIG. 11 is a partial cutaway plan view of a main portion of an elastic wave device according to a fifth preferred embodiment of the present invention.

As in the fifth preferred embodiment shown in FIG. 11, the dimension of each cavity 15 in a central busbar portion 11B in the propagation direction of a surface acoustic wave may be made large. Here, the pitch between connecting portions 16 and 16 on respective sides of the corresponding cavity 15 is twice the period of the first electrode fingers 13 along the propagation direction of a surface acoustic wave. In this way, the shape of each cavity is larger than that of each cavity in the first preferred embodiment. The other structural features are the same as those according to the first preferred embodiment. Even in this preferred embodiment, since an acoustic velocity V5 in a region V5, which is a high acoustic velocity region, is able to be effectively increased, it is possible to reliably confine an elastic wave while effectively suppressing transverse mode ripples. In particular, since the area of each cavity 15 is increased, it is possible to even more effectively increase the acoustic velocity V5 in the region V5.

Figure 12:
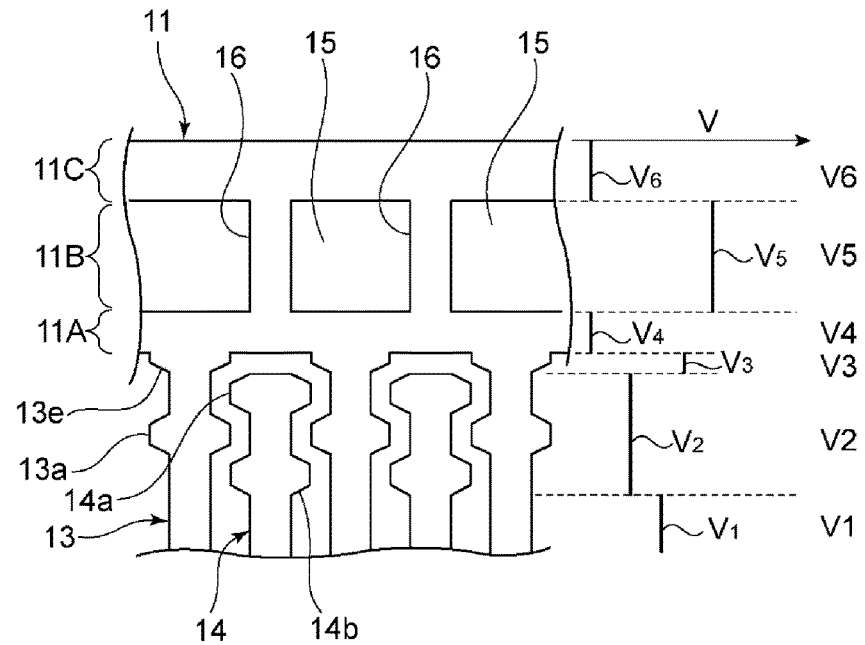
FIG. 12 is a partial cutaway plan view of a main portion of an elastic wave device according to a sixth preferred embodiment of the present invention.

In the sixth preferred embodiment shown in FIG. 12, each connecting portion 16 is positioned on a line of extension from a distal end of a second electrode finger 14. In this way, each connecting portion 16 may be provided on the line of extension from the corresponding second electrode finger 14 instead of on the line of extension from the corresponding first electrode finger 13. In this case, in order to increase symmetry, on the side of a second busbar 12, it is desirable to provide the connecting portions on the lines of extensions from distal ends of the first electrode fingers 13.

Figure 13:
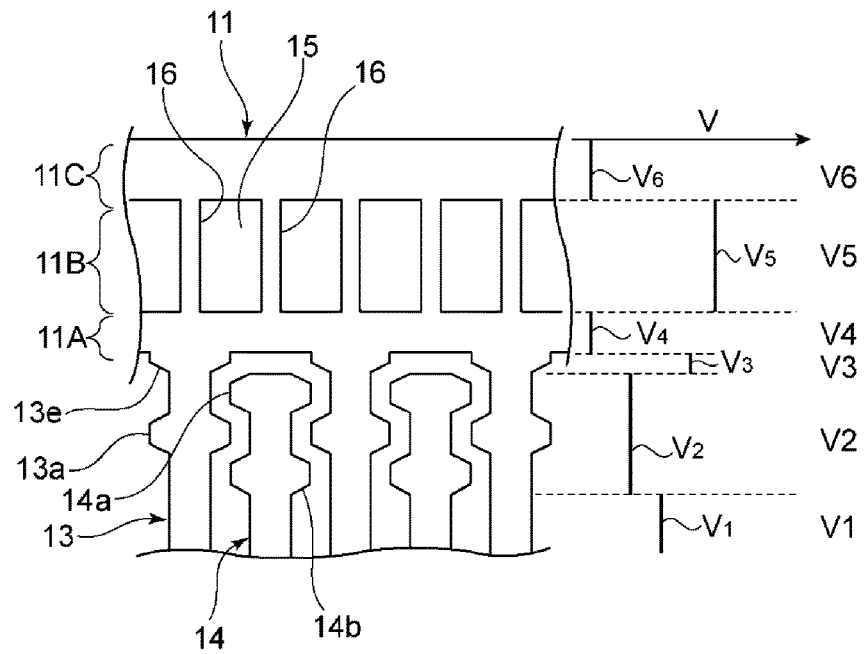
FIG. 13 is a partial cutaway plan view of a main portion of an elastic wave device according to a seventh preferred embodiment of the present invention.
Figure 14:
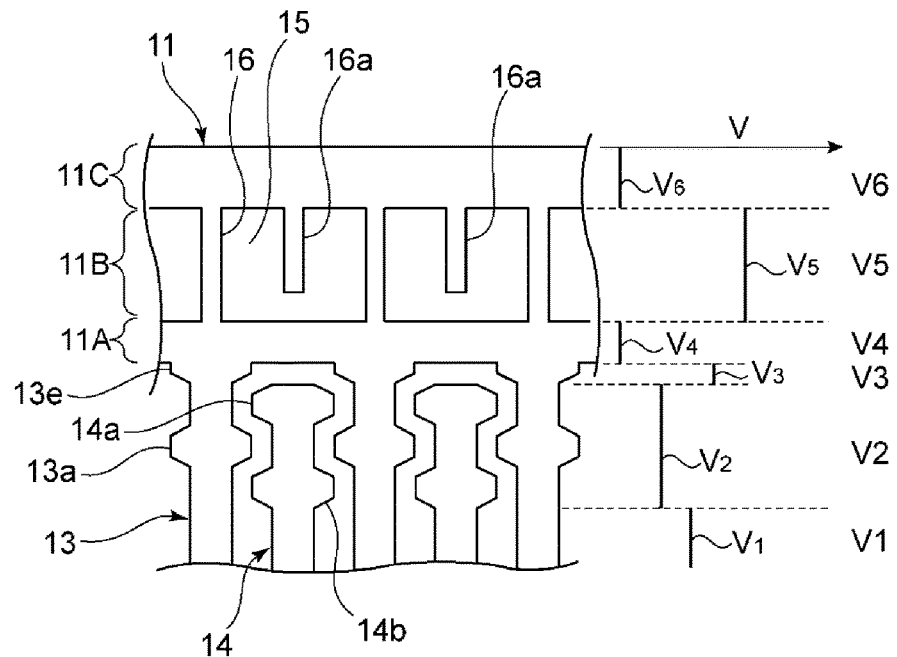
FIG. 14 is a partial cutaway plan view of a main portion of an elastic wave device according to an eighth preferred embodiment of the present invention.

In the seventh preferred embodiment shown in FIG. 13, the width of each connecting portion 16, that is, the dimension of each connecting portion 16 in the propagation direction of a surface acoustic wave is smaller than those of electrode fingers and electrode fingers 14. The connecting portions 16 are provided on lines of extension from the first electrode fingers 13 or the second electrode fingers 14. Therefore, the size of each cavity 15 along the propagation direction of a surface acoustic wave is small. In this way, the arrangement of the connecting portions 16 is able to be changed as appropriate. As in the eighth preferred embodiment shown in FIG. 14, instead of the connecting portions 16, an electrode strip 16a extending from an outer busbar portion 11C and not reaching an inner busbar portion 11A may be provided for every other connecting portion 16 shown in FIG. 13 along the propagation direction of a surface acoustic wave. An electrode strip extending in a direction opposite to that in which the electrode strips 16a extend, extending from the inner busbar portion 11A towards the outer busbar portion 11C, and not reaching the outer busbar portion 11C may be provided.

Figure 15:
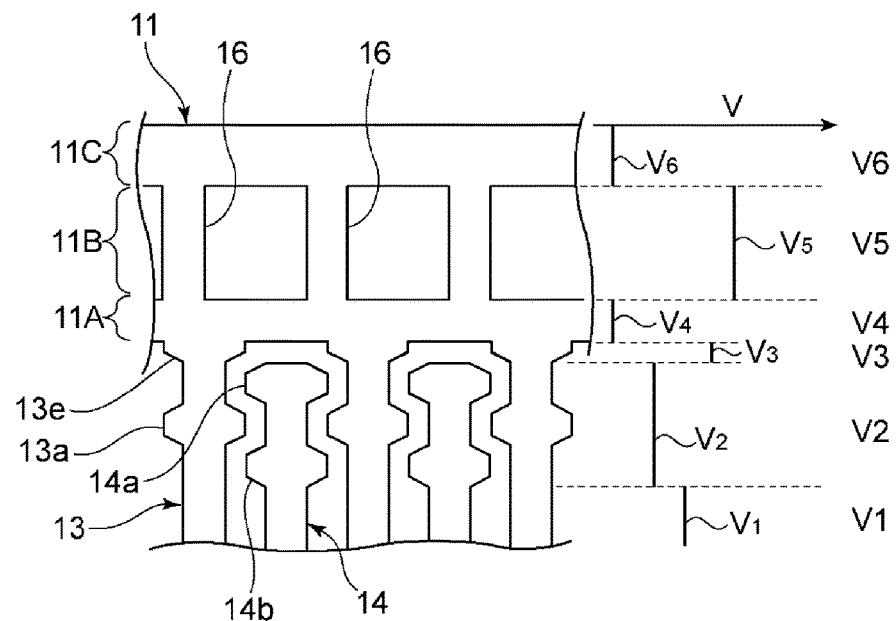
FIG. 15 is a partial cutaway plan view of a main portion of an elastic wave device according to a ninth preferred embodiment of the present invention.

Further, as in the ninth preferred embodiment shown in FIG. 15, the positions of a plurality of connecting portions 16 may be displaced in the propagation direction of a surface acoustic wave from lines of extension from electrode fingers 13 and electrode fingers 14.

Figure 16:
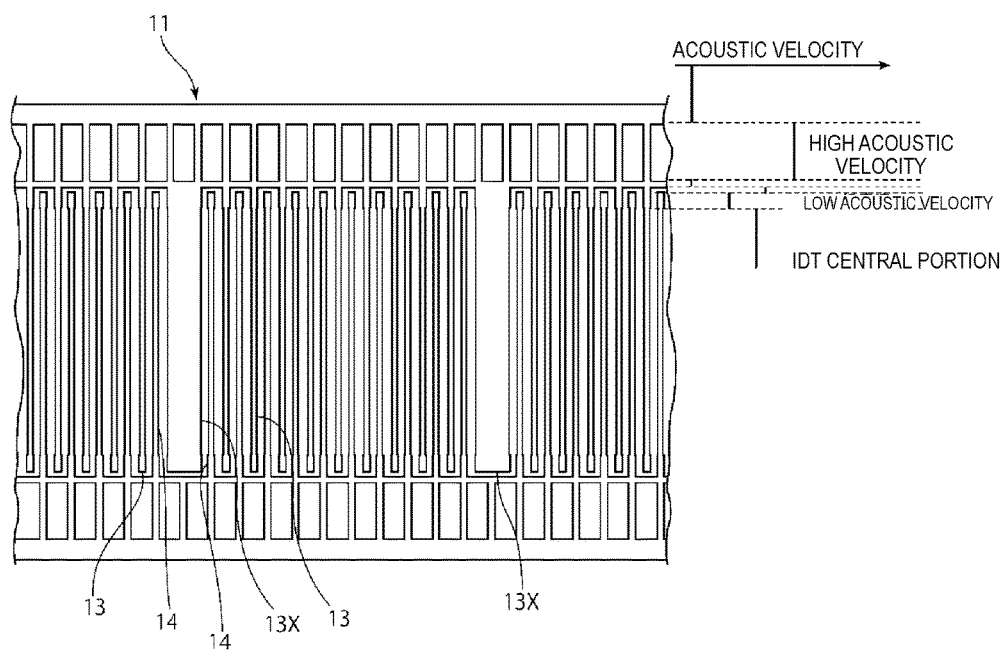
FIG. 16 is a partial cutaway plan view of a main portion of an elastic wave device according to a tenth preferred embodiment of the present invention.

FIG. 16 is a partial cutaway plan view of a main portion of an elastic wave device according to a tenth preferred embodiment of the present invention. In the elastic wave device according to the tenth preferred embodiment, first electrode fingers 13 and second electrode fingers 14 are adjacent to each other in the propagation direction of a surface acoustic wave. Of the plurality of first electrode fingers 13, the widths of electrode fingers 13X are larger than the widths of the other electrode fingers 13. More specifically, the width of an electrode finger 13X is equal or substantially equal to the width of the electrode finger 13+the dimension of a portion between an electrode finger 13 and an electrode finger 14 in the propagation direction of a surface acoustic wave (that is, the width of this portion)+ the width of the second electrode finger 14+the size of a gap between the second electrode finger 14 and a first electrode finger 13 in the propagation direction of a surface acoustic wave+the width of the first electrode finger 13. In other words, the polarity of one second electrode finger 14 is reversed and set as a first electrode finger 13. A structure in which a metal film, which is used to form an electrode finger, is embedded in a gap between first electrode finger 13 provided by the polarity conversion and the first electrode fingers 13 on both sides thereof corresponds to an electrode finger 13X.

In the tenth preferred embodiment, in an IDT electrode 3, at least some of the electrode fingers are electrode fingers 13X and are subjected to withdrawal weighting. Therefore, an elastic wave filter achieves increased steepness in filter characteristics.

As shown in FIGS. 8 to 16, the shape of the cavities 15, the dimension, the shape, the pitch, etc. of the connecting portions 16 according to preferred embodiments of the present invention may be variously changed as along as the acoustic velocity $V_5$ in the region V5, which is a high acoustic velocity region, is able to be increased; and the structures thereof are not particularly limited to the illustrated structures.

As long as the average value of the acoustic velocities $V_2$ to $V_4$ in the regions V2 to V4, which are low acoustic velocity regions, can be made low, for example, the shape and the dimension of the wide width portions 13a, 13b, 14a, and 14b may be changed as appropriate.

As mentioned above, at portions where the electrode fingers 13 and the electrode fingers 14 are adjacent to each other, only the electrode fingers 13 or the electrode fingers 14 may include a wide width portion, or the electrode fingers 13 and the electrode fingers 14 may include a wide width portion. Further, a wide width portion may be provided only towards the side of the proximal end from the central region of each electrode finger, or only towards the side of the distal end from the central region of each electrode finger. That is, the width portions may be provided towards at least one of the side of the proximal end and the side of the distal end.

The number of wide width portions in the low acoustic velocity region is not limited to one or two. Any number of wide width portions may be used.

Preferred embodiments of the present invention are applicable not only to a surface acoustic wave device, but also to various other types of elastic wave devices, such as a boundary acoustic wave device. In addition, preferred embodiments of the present invention are applicable not only to an elastic wave device having electrode structures defining a one-port resonator, but also to various other types of elastic wave filters, such as trap filters and bandpass filters, that is, ladder filters and longitudinally coupled resonator-type filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
 a piezoelectric film;
 a high acoustic velocity material in which an acoustic velocity of a bulk wave that propagates through the high acoustic velocity material is higher than that of an elastic wave that propagates through the piezoelectric film;
 a low acoustic velocity film which is laminated on the high acoustic velocity material and in which an acoustic velocity of a bulk wave that propagates through the low acoustic velocity film is lower than that of the elastic wave that propagates through the piezoelectric film; and
 an IDT electrode on one surface of the piezoelectric film; wherein the piezoelectric film is laminated on the low acoustic velocity film;

the IDT electrode includes a first busbar, a second busbar that is spaced apart from the first busbar, a plurality of first electrode fingers with proximal ends electrically connected to the first busbar and distal ends extending towards the second busbar, and a plurality of second electrode fingers with proximal ends connected to the second busbar and distal ends extending towards the first busbar;

a direction that is perpendicular or substantially perpendicular to a direction in which the first electrode fingers and the second electrode fingers extend is a width direction, the first electrode fingers, or the second electrode fingers, or each of the first electrode fingers and the second electrode fingers, includes a wide width portion with a dimension in the width direction that is larger than a dimension at a center in a length direction of the first electrode fingers and the second electrode fingers and being provided closer to at least one of a side of the proximal end and a side of the distal end than a central region;

at least one of the first busbar and the second busbar includes a plurality of cavities that are distributed in a length direction of the first busbar or the second busbar; and the first busbar, or the second busbar, or each of the first busbar and the second busbar, includes an inner busbar portion which is positioned closer to a side of the first electrode fingers or a side of the second electrode fingers than the cavities are and which extends in the length direction of the first busbar and the second busbar, a central busbar portion that includes the cavities, and an outer busbar portion that is positioned opposite to the inner busbar portion with the central busbar portion being interposed therebetween.

2. The elastic wave device according to claim 1, wherein each inner busbar portion has a shape of a belt that extends in an elastic wave propagation direction.

3. The elastic wave device according to claim 1, wherein the first electrode fingers and the second electrode fingers each include the wide width portion.

4. The elastic wave device according to claim 1, wherein the first electrode fingers, or the second electrode fingers, or the first electrode fingers and the second electrode fingers each include a plurality of the wide width portions.

5. The elastic wave device according to claim 1, wherein the IDT electrode is not subjected to apodization weighting.

6. The elastic wave device according to claim 1, wherein, a wavelength of a surface acoustic wave is λ, a distance between the distal end of each first electrode finger and the second busbar opposing the distal end of each first electrode finger and a distance between the distal end of each second electrode finger and the first busbar opposing the distal end of each second electrode fingers is about 0.5λ or less.

7. The elastic wave device according to claim 1, further comprising a supporting substrate that supports the high acoustic velocity material, wherein the high acoustic velocity material is a high acoustic velocity film.

8. The elastic wave device according to claim 1, wherein the high acoustic velocity material is a high acoustic velocity supporting substrate.

9. The elastic wave device according to claim 1, wherein a polarity of at least one electrode finger in the IDT electrode is reversed and an electrode material is embedded in a gap between the electrode finger with reversed polarity and adjacent electrode fingers on both sides thereof.

10. The elastic wave device according to claim 1, wherein the IDT electrode is made of Al or an alloy with a main constituent that is Al, and an electrode film thickness of the IDT electrode is about 0.08λ or greater.

11. The elastic wave device according to claim 1, wherein a film thickness of the IDT electrode is about 0.10λ or greater and about 400 nm or less.

12. The elastic wave device according to claim 1, wherein the high acoustic velocity material is a silicon substrate, and a volume resistivity thereof is about 1000 Ωcm or greater.

13. The elastic wave device according to claim 1, wherein the high acoustic velocity material is a silicon substrate, and a volume resistivity thereof is about 4000 Ωcm or greater.

14. The elastic wave device according to claim 1, wherein the elastic wave device is a one-port surface acoustic wave resonator.

15. The elastic wave device according to claim 1, further comprising reflectors located at opposite ends of the IDT electrode.

16. The elastic wave device according to claim 1, further comprising protrusions that are provided on the proximal ends of the electrode fingers and protrude in a width direction of the electrode fingers.

17. The elastic wave device according to claim 1, wherein the elastic wave device is structured to operate in a piston mode.

18. The elastic wave device according to claim 1, wherein a duty ratio of the electrode finger is about 0.6 to about 0.9.

19. The elastic wave device according to claim 1, wherein a distance between the distal ends of the second electrode fingers and the first busbar is about 0.5λ or less, where λ is a wavelength of a surface wave propagating in the elastic wave device.

20. The elastic wave device according to claim 1, wherein a distance between the distal ends of the second electrode fingers and the first busbar is about 0.25λ or less, where λ is a wavelength of a surface wave propagating in the elastic wave device.

21. The elastic wave device according to claim 1, wherein
an acoustic velocity of the inner busbar portion is lower than an acoustic velocity of the central region.

22. The elastic wave device according to claim 1, wherein
an acoustic velocity of the central busbar portion is higher than an acoustic velocity of the central region.

23. The elastic wave device according to claim 21, wherein
an acoustic velocity of the central busbar portion is higher than an acoustic velocity of the central region.

* * * * *